United States Patent
Lin

(10) Patent No.: US 9,130,086 B2
(45) Date of Patent: Sep. 8, 2015

(54) LIGHT SENSOR AND MANUFACTURING METHOD THEREOF

(71) Applicant: uPI semiconductor corp., Zhubei, Hsinchu County (TW)

(72) Inventor: Ping-Yuan Lin, Zhubei (TW)

(73) Assignee: UPI SEMICONDUCTOR CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 14/305,043

(22) Filed: Jun. 16, 2014

(65) Prior Publication Data

US 2015/0048374 A1    Feb. 19, 2015

(30) Foreign Application Priority Data

Aug. 16, 2013   (TW) ................................. 102129589

(51) Int. Cl.
   *H01L 31/20*       (2006.01)
   *H01L 31/0376*     (2006.01)
   *H01L 31/105*      (2006.01)

(52) U.S. Cl.
   CPC ...... *H01L 31/03762* (2013.01); *H01L 31/1055* (2013.01); *H01L 31/202* (2013.01)

(58) Field of Classification Search
   USPC ......................................................... 257/53
   See application file for complete search history.

(56) References Cited

U.S. PATENT DOCUMENTS

| | | | |
|---|---|---|---|
| 6,429,036 B1 | 8/2002 | Nixon et al. | |
| 7,521,335 B2 | 4/2009 | Yamanaka | |
| 7,663,231 B2 | 2/2010 | Chang et al. | |
| 7,932,121 B2 | 4/2011 | Watanabe | |
| 8,193,013 B2 | 6/2012 | Kita | |
| 2006/0091488 A1* | 5/2006 | Kang | 257/433 |
| 2010/0053318 A1* | 3/2010 | Sasaki | 348/125 |
| 2013/0075607 A1 | 3/2013 | Bikumandla et al. | |

OTHER PUBLICATIONS

Office Action issued in corresponding Taiwan application (dated May 27, 2015).

* cited by examiner

*Primary Examiner* — Thao P Le
(74) *Attorney, Agent, or Firm* — McClure, Qualey & Rodack, LLP

(57) ABSTRACT

A light sensor and a manufacturing method thereof are disclosed. The light sensor is capable of being coupled to a carry object and includes a sensing chip and a plurality of conductive connecting elements. The sensing chip includes a first surface and a second surface opposite to each other. The sensing chip also includes a sensing unit disposed between the first surface and the second surface and at least partially exposed by a window formed on the second surface. The first surface faces the carry object when the light sensor is coupled to a carry object. The conductive connecting elements are disposed on the first surface and coupled to the sensing unit in order to couple the light sensor to the carry object.

9 Claims, 8 Drawing Sheets

LIGHT SENSOR AND MANUFACTURING METHOD THEREOF

BACKGROUND OF THE INVENTION

1. Field of the Invention

This invention generally relates to the packaging of a light sensor. More particularly, this invention relates to a light sensor and a manufacturing method thereof.

2. Description of the Prior Art

To an industry, more particularly to the automation industry, sensing devices are indispensable. Sensing devices commonly seen include light sensor, temperature sensor, pressure sensor, humidity sensor, and distance sensor, etc. The light sensor is broadly used in various electronic devices with displays since it is capable of sensing ambient light for the purpose of providing a reference value to the display so that the display brightness may be adjusted accordingly to save energy.

In a conventional packaging process, the chip and the carry object of a light sensor are coupled by a wire. Since it is necessary to reserve a gap for wire coupling, it is difficult to minimize the size of the light sensor module. On the other hand, some packaging materials are easily softened by heat and may consequently pull and break the wire or disconnect the wire from a lead frame.

SUMMARY OF THE INVENTION

It is an object of the present invention to provide a light sensor and a manufacturing method thereof to solve the above-mentioned problems in prior arts.

The light sensor is capable of being coupled to a carry object. The light sensor includes a sensing chip and a plurality of conductive connecting elements. The sensing chip includes a first surface, a second surface, and a sensing unit. The first surface faces the carry object when the light sensor is coupled to the carry object. The second surface is opposite to the first surface and has a window formed toward the inside of the sensing chip. The sensing unit is disposed between the first and the second surfaces and is at least partially exposed by the window. A plurality of conductive connecting elements are disposed on the first surface and coupled to the sensing unit in order to couple the light sensor to the carry object.

The sensing chip further includes a substrate and a cover. The substrate has the first surface and a supporting surface opposite to each other, wherein the sensing unit is disposed on the supporting surface. The cover covers the supporting surface and has a window to at least partially expose the sensing unit.

The conductive connecting elements are solder balls. The sensing unit has a third surface and a fourth surface opposite to each other, wherein the third surface is close to the first surface, and the fourth surface is at least partially exposed by the window. The sensing unit is a PIN diode. The sensing unit is a stack structure. The sensing unit is a five-layer stack structure, including: a lower electrode; a first conductive hydrogenated amorphous silicon (a-Si:H) layer disposed on the lower electrode; an intrinsic hydrogenated amorphous silicon layer disposed on the first conductive hydrogenated amorphous silicon layer; a second conductive hydrogenated amorphous silicon layer disposed on the intrinsic hydrogenated amorphous silicon layer; and an upper electrode disposed on the second conductive hydrogenated amorphous silicon layer and at least partially exposed by the window. The light sensor further includes a lens disposed on the window. A sensing device includes the light sensor and a carry object coupled to the plurality of conductive connecting elements.

The light sensor manufacturing method includes: providing a sensing chip, wherein the sensing chip has a first surface and a supporting surface opposite to each other; disposing a sensing unit on the supporting surface; disposing a cover on the supporting surface to cover the supporting surface and the sensing unit; disposing a plurality of conductive connecting elements on the first surface to be coupled to the sensing unit; and forming a window on the cover to at least partially expose the sensing unit.

In another embodiment, the light sensor manufacturing method includes: providing a substrate, wherein the substrate has a first surface and a supporting surface opposite to each other; disposing a sensing unit on the supporting surface; disposing a cover on the supporting surface to cover the supporting surface and the sensing unit; forming a window on the cover to at least partially expose the sensing unit; and disposing a plurality of conductive connecting elements on the first surface to be coupled to the sensing unit.

The light sensor manufacturing method further includes disposing a lens on the window. The steps of disposing a plurality of conductive connecting elements on the first surface include making the projections of the sensing unit and the plurality of conductive connecting elements along the normal direction of the first surface at least partially overlap with each other. The steps of disposing the plurality of conductive connecting elements on the first surface include using solder balls as the conductive connecting elements.

The steps of disposing the sensing unit on the supporting surface include: disposing a lower electrode on the supporting surface; disposing a first conductive hydrogenated amorphous silicon (a-Si:H) layer on the lower electrode; disposing an intrinsic hydrogenated amorphous silicon layer on the first conductive hydrogenated amorphous silicon layer; disposing a second conductive hydrogenated amorphous silicon layer on the intrinsic hydrogenated amorphous silicon layer; and disposing an upper electrode on the second conductive hydrogenated amorphous silicon layer.

Accordingly, the light sensor of the present invention could be manufactured with lower cost and smaller size.

It is another object of the present invention to provide a light sensor manufacturing method with lower cost to solve the above-mentioned problems in prior arts.

It is to be understood that the above description and the embodiments below are merely illustrative and are not to be considered limitations in the scope of the invention.

DETAILED DESCRIPTION OF THE PREFERRED EMBODIMENT

In the following embodiments, when a unit is said to be "connected to" or "coupled to" another unit, it could be either directly connected to or coupled to the other unit or other unit may be disposed between the same.

Figure 1:
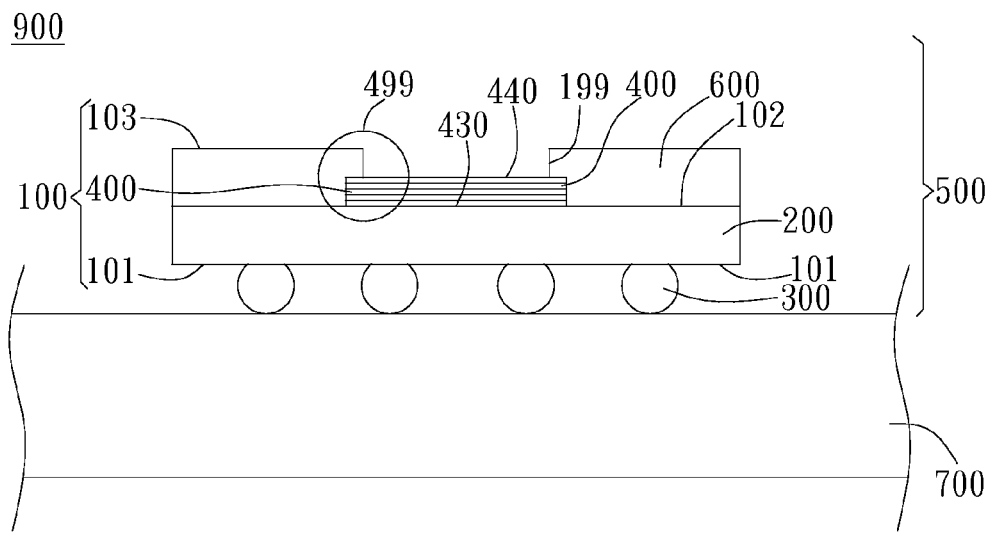
FIG. 1 is a schematic view of the preferred embodiment of the light sensor of the present invention.

As the preferred embodiment shown in FIG. 1, a light sensor 500 is capable of being coupled to a carry object 700 to form a sensing device 900. The light sensor 500 includes a sensing chip 100 and a plurality of conductive connecting elements 300. The sensing chip 100 includes a first surface 101, a second surface 103, and a sensing unit 400. The first surface 101 faces the carry object 700 when the light sensor 500 is coupled to the carry object 700. The second surface 103 is opposite to the first surface 101, wherein a portion of the second surface 103 forms a window 199 toward the inside of the sensing chip 100. The sensing unit 400 is disposed between the first surface 101 and the second surface 103 and is at least partially exposed by the window 199. More particularly, the sensing unit 400 has a third surface 430 and a fourth surface 440 opposite to each other, wherein the third surface 430 is close to the first surface 101, and the fourth surface 440 is at least partially exposed by the window 199. A plurality of conductive connecting elements 300 are disposed on the first surface 101 and are coupled to the sensing unit 400 in order to couple the light sensor 500 to the carry object 700. In the embodiment, the carry object 700 can be a printed circuit board, a ceramic board, or boards made of other materials. In the embodiment, the conductive connecting elements 300 are preferably solder balls, which could be presented as a ball grid array (BGA). In different embodiments, however, the conductive connecting elements could be pillars.

Taking a different point of view, the sensing chip 100 further includes a substrate 200 and a cover 600. The substrate 200 has the first surface 101 and a supporting surface 102 opposite to each other, wherein the sensing unit 400 is disposed on the supporting surface 102. The cover 600 covers the supporting surface 102 and forms the window 199 to at least partially expose the sensing unit 400.

As shown in FIG. 1, in the light sensor 500, the interference caused by the sheltering of sensing unit 400 by the conductive connecting elements 300 can be reduced since the sensing unit 400 and the conductive connecting elements 300 are disposed on different faces. More specifically, in the preferred embodiment, because the sensing unit 400 is at least partially exposed by the window 199, the targeting signal or substance to be sensed can reach the sensing unit 400 through the window 199. Further, the conductive connecting elements 300 are disposed on the first surface 101 which is opposite to the supporting surface 102 that has the sensing unit 400 disposed thereon. Accordingly, using BGAs as the conductive connecting elements in the light sensor 500 of the embodiment will not shelter the sensing unit 400 and cause interference. In other words, wafer level chip scale package (WLCSP) can be applied to the light sensor 500 of the embodiment. Consequently, the light sensor 500 of the embodiment and the sensing device 900 using the same could be manufactured with lower cost and smaller size.

Figure 2:
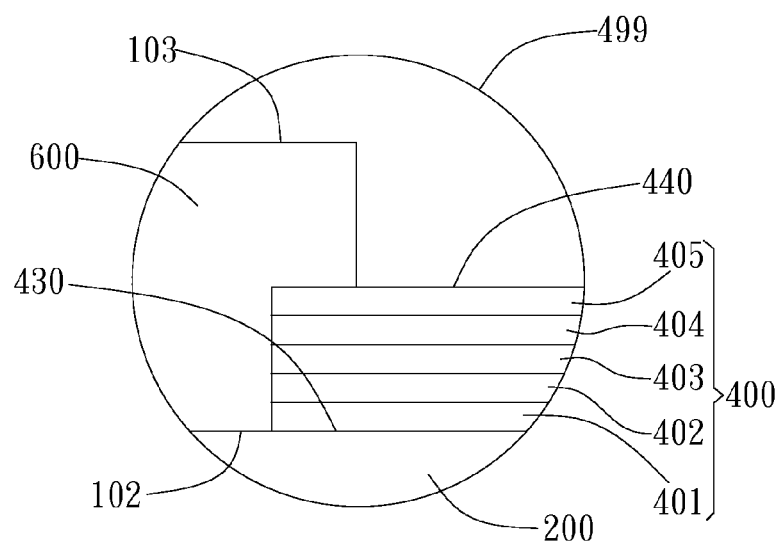
FIG. 2 is a partial enlarged view of the preferred embodiment of the light sensor of the present invention.

The sensing unit 400 includes a light sensing unit and is preferably a stack structure. More particularly, as shown in FIG. 2, which is the enlarged view of the region 499 in FIG. 1, the sensing unit 400 is preferably a five-layer stack structure, including: a lower electrode 401, a first conductive hydrogenated amorphous silicon layer 402 disposed on the lower electrode 401, an intrinsic hydrogenated amorphous silicon layer 403 disposed on the first conductive hydrogenated amorphous silicon layer 402, a second conductive hydrogenated amorphous silicon layer 404 disposed on the intrinsic hydrogenated amorphous silicon layer 403, and an upper electrode 405 disposed on the second conductive hydrogenated amorphous silicon layer 404.

The sensing unit 400 is preferably a PIN diode. In other words, the stack structure has the PIN structure, i.e. the second conductive hydrogenated amorphous silicon layer 404 is p-type, wherein the thickness is preferably between 50 Å and 500 Å; the concentration of p-type doping is preferably between $1 \times 10^{17}$ atoms/cm$^3$ and $1 \times 10^{21}$ atoms/cm$^3$; the p-type dopant could be boron. The thickness of the intrinsic hydrogenated amorphous silicon layer 403 is preferably between 500 Å and 5000 Å. The first conductive hydrogenated amorphous silicon layer 402 is n-type, wherein the thickness is preferably between 50 Å and 500 Å; the concentration of n-type doping is preferably between $1 \times 10^{17}$ atoms/cm$^3$ and $1 \times 10^{21}$ atoms/cm$^3$; the n-type dopant could be phosphorus or arsenic. The lower electrode 401 is preferably a metal. The upper electrode 405 is preferably a light transparent conductive material, e.g. indium-tin oxide and indium-zinc oxide, for a light to transmit through. The thickness of the upper electrode 405 is preferably between 500 Å and 5000 Å.

Specifically, the PIN diode is capable of sensing light on both sides. Therefore, in the embodiment using PIN diode as the sensing unit 400, by forming the window 199 on the second surface 103 of the sensing chip 100 to expose the second conductive hydrogenated amorphous silicon layer 404, the second conductive hydrogenated amorphous silicon layer 404 is capable of sensing light. Accordingly, BGAs can be used as the conductive connecting elements in the light sensor 500 of the embodiment without sheltering the sensing unit 400 and causing interference.

Figure 3:
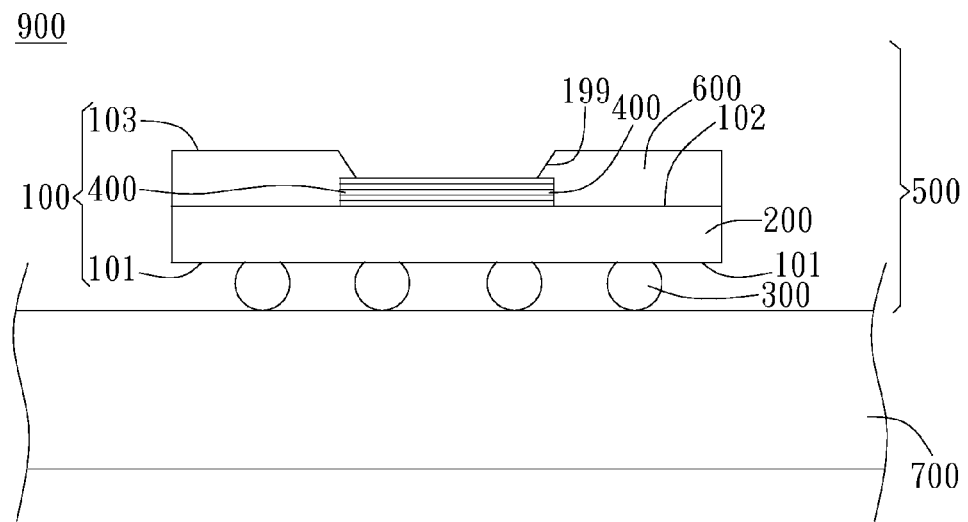
FIG. 3 is a schematic view of the preferred embodiment of the light sensor of the present invention having a window with an inclined sidewall.
Figure 4:
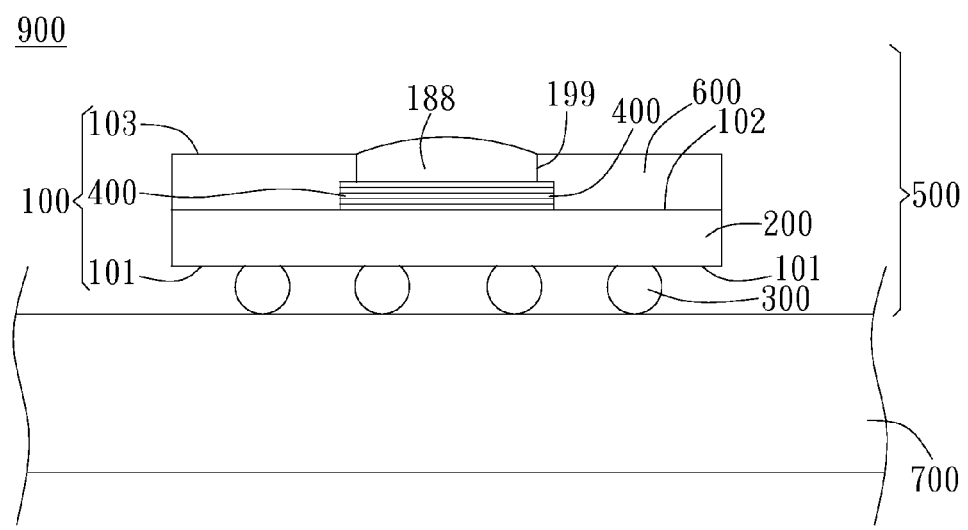
FIG. 4 is a schematic view of the preferred embodiment of the light sensor of the present invention further including a lens.

In a different embodiment shown in FIG. 3, the side wall of the window 199 further inclines to make the opening of the window 199 larger for enhancing the collecting of the signal to improve the sensing ability. As a different embodiment shown in FIG. 4, the light sensor further includes a lens 188 disposed on the window 199 to prevent contaminants, e.g. dust, from contacting the sensing unit 400 and causing interference. The lens 188 is preferably, but not limited to, a transparent epoxy resin. The curvature of the top of the lens 188 can be changed to enhance the collection of the signal to improve the sensing ability.

Figure 5A:
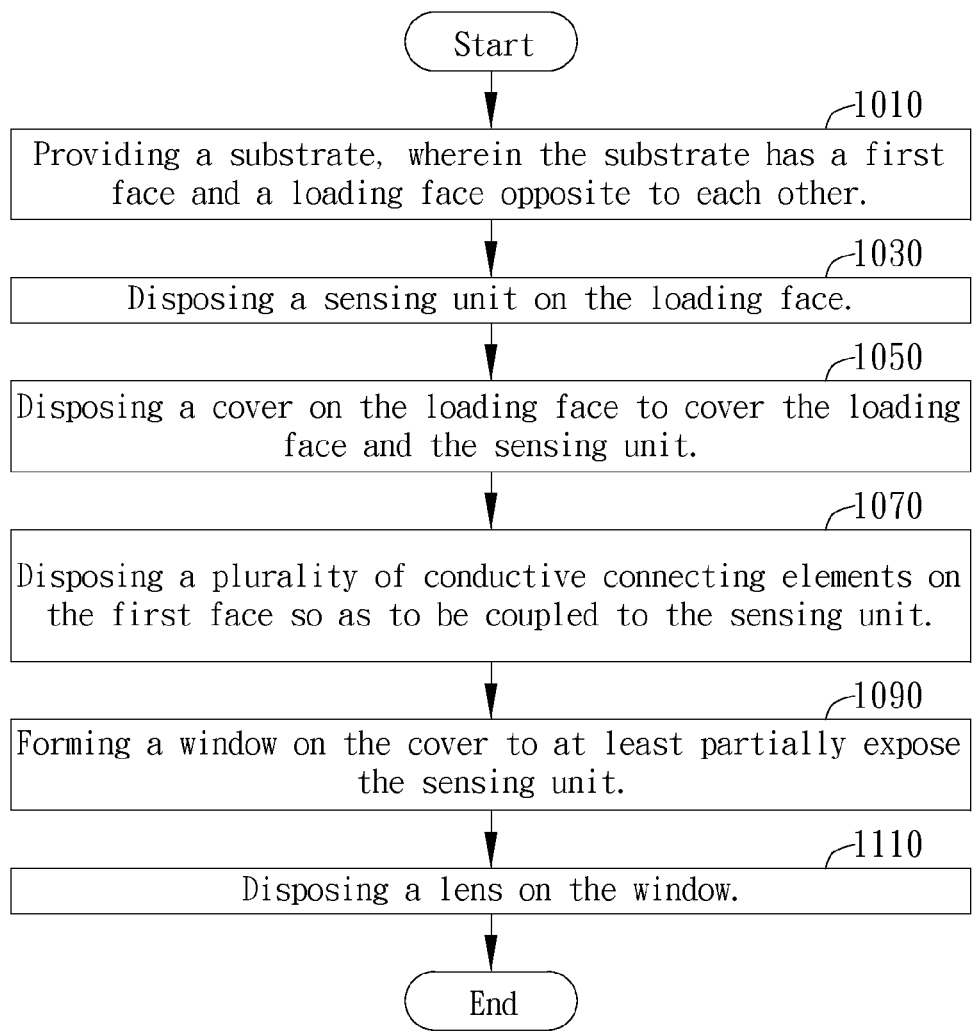
FIG. 5A is a flow chart of the light sensor manufacturing method of the present invention.

As a preferred embodiment shown in FIG. 5A, the light sensor manufacturing method includes the following steps.

Figure 6A:
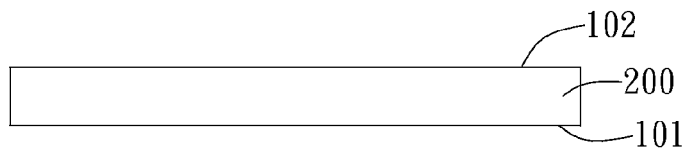
FIGS. 6A-6F are schematic views showing the manufacturing steps of the light sensor of the present invention.

Step 1010 involves providing a substrate, wherein the substrate has a first surface and a supporting surface opposite to each other. For example, the substrate is preferably a substrate 200 shown in FIG. 6A, which includes a first surface 101 and a supporting surface 102. The substrate 200 is preferably made of low dielectric coefficient material such as silicon oxide, boron-phosphorosilicate glass, phosphorosilicate glass, undoped silicate glass, fluoro-doped silicate glass, or spin-on glass. The substrate 200 may be formed by chemical vapor deposition, spin coating, and etc. A wire is formed inside the substrate 200 to couple the first surface 101 to the supporting surface 102.

Figure 6B:
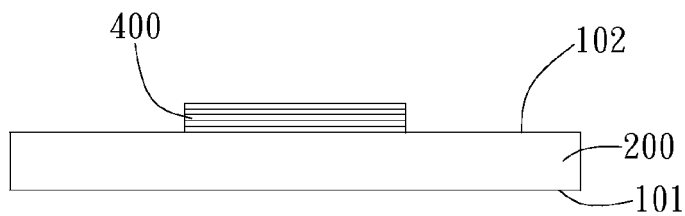

Step 1030 involves disposing a sensing unit on the supporting surface. More particularly, the sensing unit 400 is disposed on the supporting surface 102 as shown in FIG. 6B. The sensing unit is, as shown in FIG. 2, preferably a five-layer stack structure including the lower electrode 401, the first conductive hydrogenated amorphous silicon layer 402, the intrinsic hydrogenated amorphous silicon layer 403, the second conductive hydrogenated amorphous silicon layer 404, and the upper electrode 405.

Figure 6C:
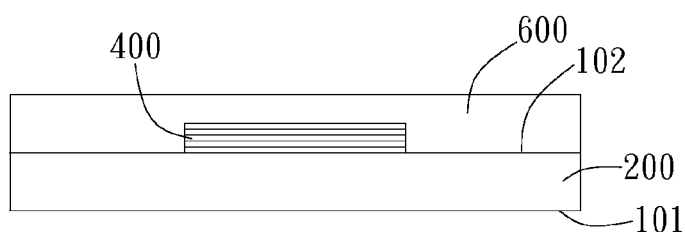

Step 1050 involves disposing a cover on the supporting surface to cover the supporting surface and the sensing unit. More particularly, as shown in FIG. 6C, the cover 600 is disposed on the supporting surface 102 to cover the supporting surface 102 and the sensing unit 400. The cover 600 is preferably made of low dielectric coefficient material such as silicon oxide, boron-phosphorosilicate glass, phosphorosilicate glass, undoped silicate glass, fluoro-doped silicate glass, or spin-on glass. The cover 600 may be formed by chemical vapor deposition, spin coating, and etc.

Figure 6D:
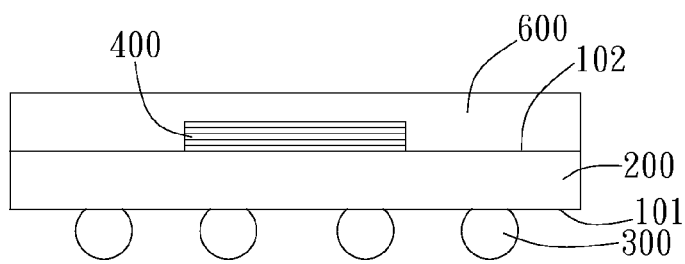

Step 1070 involves disposing a plurality of conductive connecting elements on the first surface so as to be coupled to the sensing unit. More particularly, as shown in FIG. 6D, the BGA is disposed on the first surface 101 as the conductive connecting element 300. The conductive connecting element 300 is coupled to the sensing unit 400 by the wire (not shown in figure) in the substrate 200.

Figure 6E:
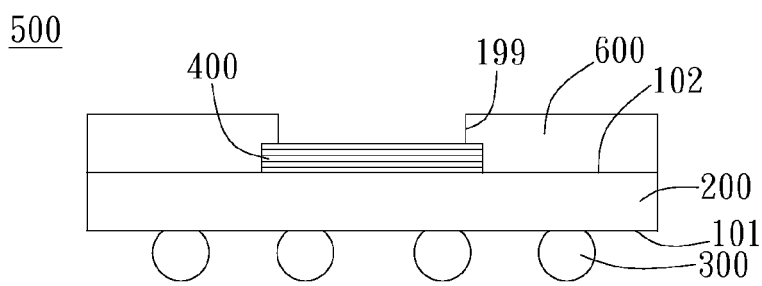

Step 1090 involves forming a window on the cover to at least partially expose the sensing unit. More particularly, as shown in FIG. 6E, the window 199 is formed on the cover 600 to at least partially expose the sensing unit 400. The window 199 may be formed on the cover 600 by dry-etching, wet-etching, laser carving, and etc.

Figure 6F:
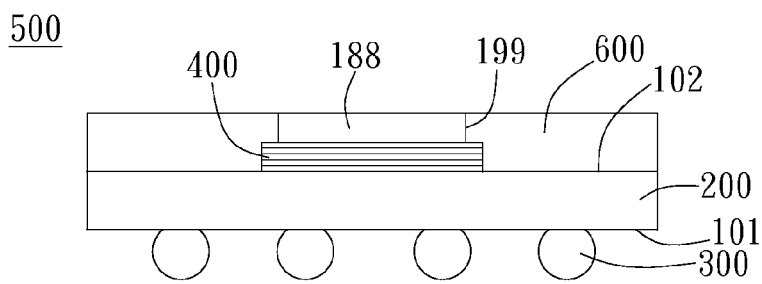

In the preferred embodiment, the light sensor manufacturing method further includes step 1110, which involves disposing a lens on the window. More particularly, a liquid-state resin is injected into the window 199 and then illuminated by ultraviolet light or heated to harden to form the lens 188 as shown in FIG. 6F. The shape of the lens 188 can be controlled by the injecting amount of the liquid-state resin. For example, when the injecting amount of the liquid-state resin is slightly more than the containable volume of the window, the liquid-state resin can protrude out of the opening of the window to form a convex lens due to surface tension.

Figure 5B:
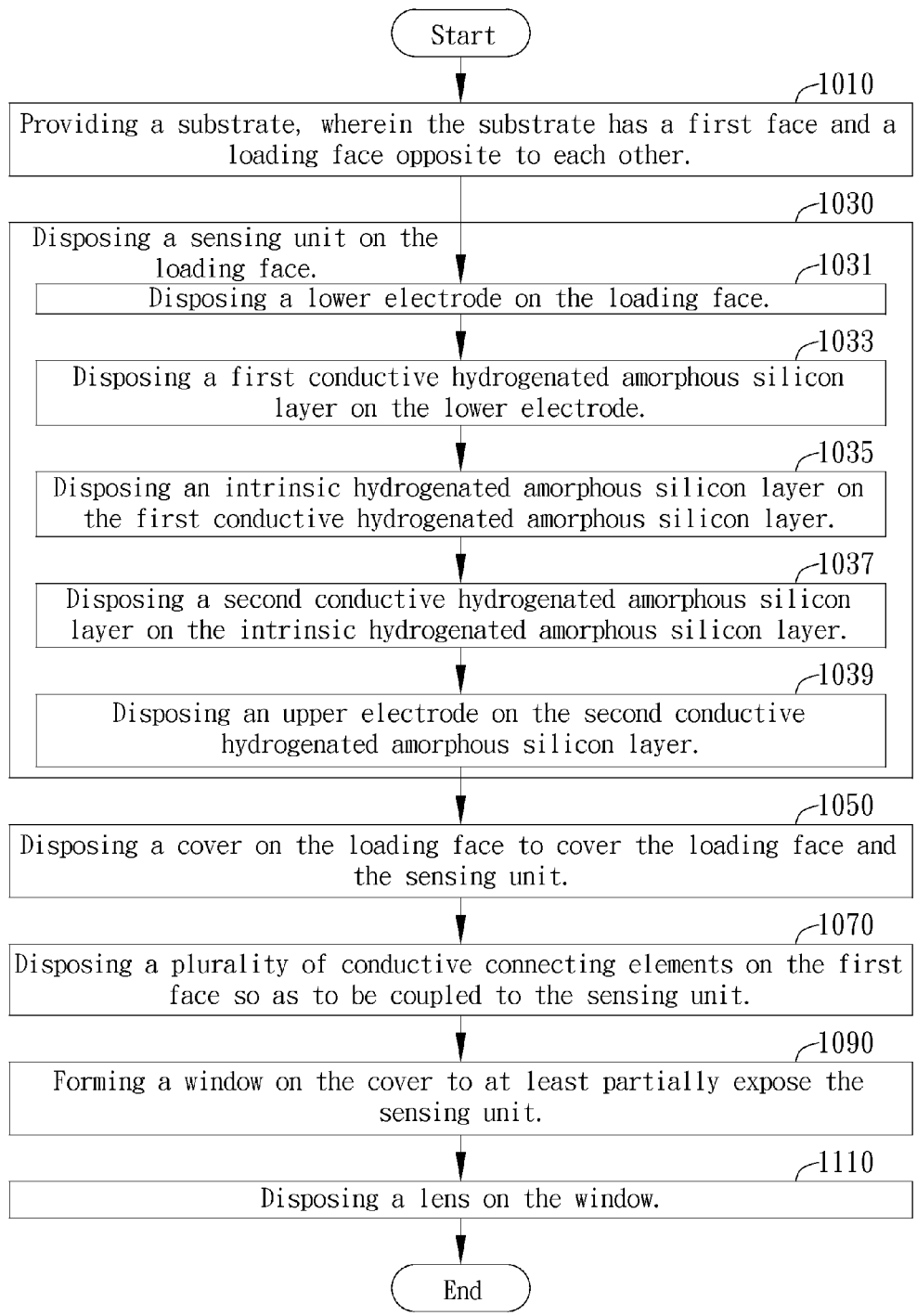
FIG. 5B is a flow chart of disposing the sensing unit in an embodiment of the present invention.

As a preferred embodiment shown in FIG. 5B, the above step 1030 includes the following steps.

Step 1031 involves disposing a lower electrode on the supporting surface. More particularly, metals such as gold, silver, copper, titanium, tungsten, molybdenum, chromium, aluminum, the stacks or the alloys thereof, or other conductive materials are deposited by physical vapor deposition or chemical vapor deposition and then patterned by photolithography process to form the lower electrode 401 (FIG. 2), which is coupled to the wire (not shown in figure) in the substrate 200.

Step 1033 involves disposing a first conductive hydrogenated amorphous silicon layer on the lower electrode. Step 1035 involves disposing an intrinsic hydrogenated amorphous silicon layer on the first conductive hydrogenated amorphous silicon layer. Step 1037 involves disposing a second conductive hydrogenated amorphous silicon layer on the intrinsic hydrogenated amorphous silicon layer. A plasma enhanced chemical vapor deposition method is preferably used in steps 1033, 1035, and 1037, wherein $B_2H_6/H_2$ and $PH_3/H_2$ are used as reacting doping gas, and the type or concentration of doping changes during the process of deposition. The stack of layers is then patterned by photolithography and etching processes. The second conductive hydrogenated amorphous silicon layer 404 is p-type, wherein the thickness is preferably between 50 Å and 500 Å; the concentration of p-type doping is preferably between $1\times10^{17}$ atoms/$cm^3$ and $1\times10^{21}$ atoms/$cm^3$; the p-type dopant could be boron. The thickness of the intrinsic hydrogenated amorphous silicon layer 403 is preferably between 500 Å and 5000 Å. The first conductive hydrogenated amorphous silicon layer 402 is n-type, wherein the thickness is preferably between 50 Å and 500 Å; the concentration of n-type doping is preferably between $1\times10^{17}$ atoms/$cm^3$ and $1\times10^{21}$ atoms/$cm^3$; the dopant could be phosphorus or arsenic.

Step 1039 involves disposing an upper electrode on the second conductive hydrogenated amorphous silicon layer. More particularly, materials such as indium-tin oxide or indium-zinc oxide may be deposited onto the second conductive hydrogenated amorphous silicon layer 404 by sputtering and patterned by photolithography and etching processes.

Figure 7:
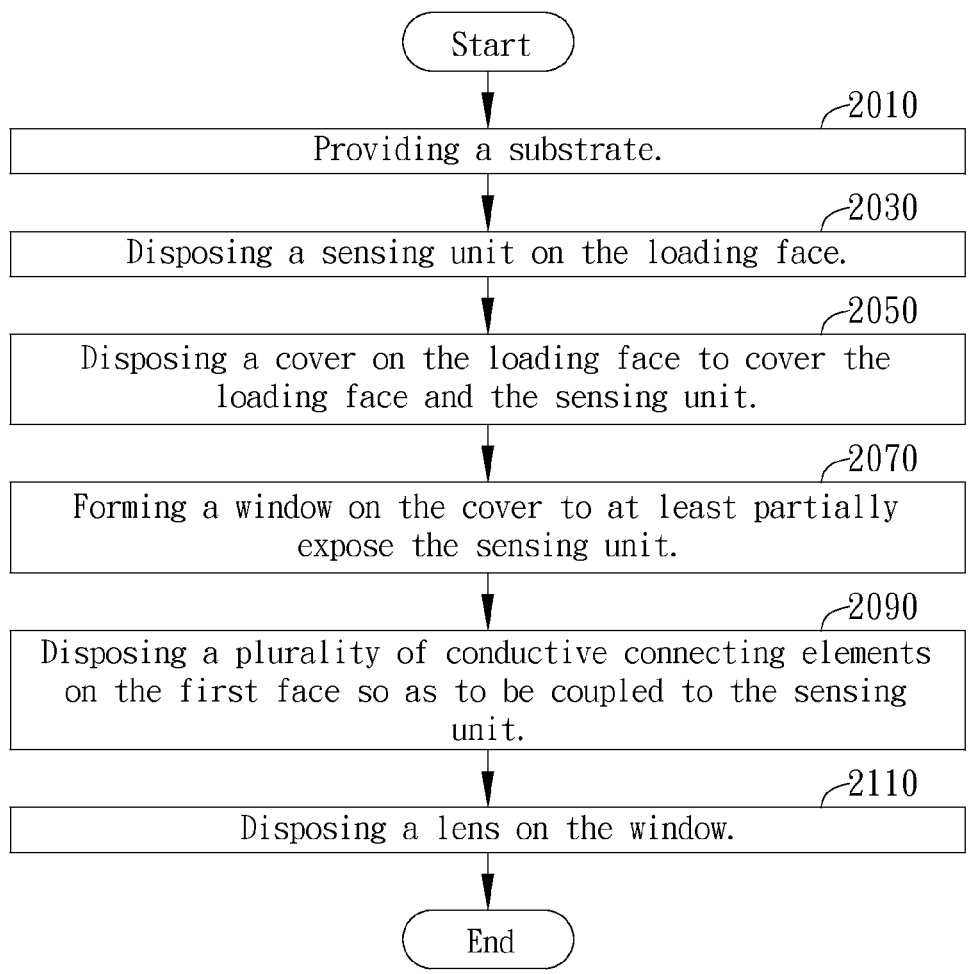
FIG. 7 is another flow chart of the light sensor manufacturing method of the present invention.

As shown in FIG. 7, in another embodiment, the light sensor manufacturing method includes the following steps.

Figure 8A:
FIGS. 8A-8F are different schematic views showing the manufacturing steps of the light sensor of the present invention.

Step 2010 involves providing a substrate. More particularly, as shown in FIG. 8A, the substrate 200 having a first surface 101 and a supporting surface 102 opposite to each other is provided. The substrate 200 is preferably made of low dielectric coefficient material such as silicon oxide, boron-phosphorosilicate glass, phosphorosilicate glass, undoped silicate glass, fluoro-doped silicate glass, or spin-on glass. The substrate 200 may be formed by chemical vapor deposition, and spin coating, etc. A wire is formed inside the substrate 200 to couple the first surface 101 to the supporting surface 102.

Figure 8B:
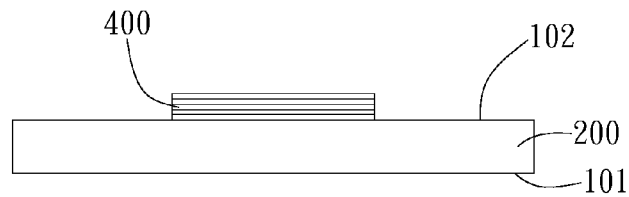

Step 2030 involves disposing a sensing unit on the supporting surface. More particularly, the sensing unit 400 is disposed on the supporting surface 102 as shown in FIG. 8B. The sensing unit 400 is, as shown in FIG. 2, preferably a five-layer stack structure including the lower electrode 401, the first conductive hydrogenated amorphous silicon layer 402, the intrinsic hydrogenated amorphous silicon layer 403, the second conductive hydrogenated amorphous silicon layer 404, and the upper electrode 405. The sensing unit 400 is preferably disposed by performing the steps 1031, 1033, 1035, 1037, and 1039.

Figure 8C:
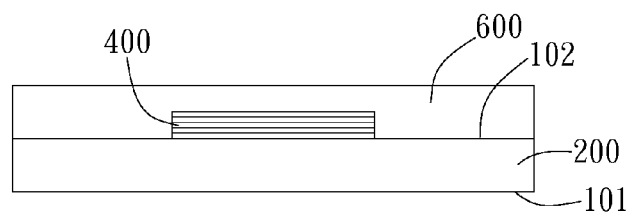

Step 2050 involves disposing a cover on the supporting surface to cover the supporting surface and the sensing unit. More particularly, as shown in FIG. 8C, the cover 600 is disposed on the supporting surface 102 to cover the supporting surface 102 and the sensing unit 400. The cover 600 is preferably made of low dielectric coefficient material such as silicon oxide, boron-phosphorosilicate glass, phosphorosilicate glass, undoped silicate glass, fluoro-doped silicate glass, or spin-on glass. The cover 600 may be formed by chemical vapor deposition, spin coating, and etc.

Figure 8D:
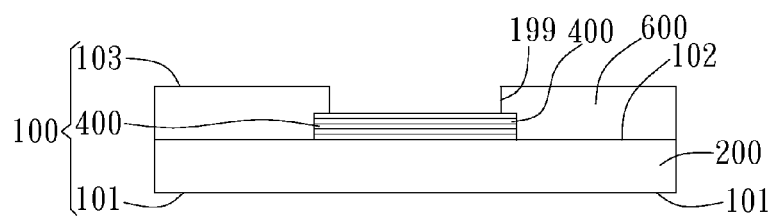

Step 2070 involves forming a window on the cover to at least partially expose the sensing unit. More particularly, as shown in FIG. 8D, the window 199 is formed on the cover 600 to at least partially expose the sensing unit 400. The window 199 may be formed on the cover 600 by dry-etching, wet-etching, laser carving, and etc.

Figure 8E:
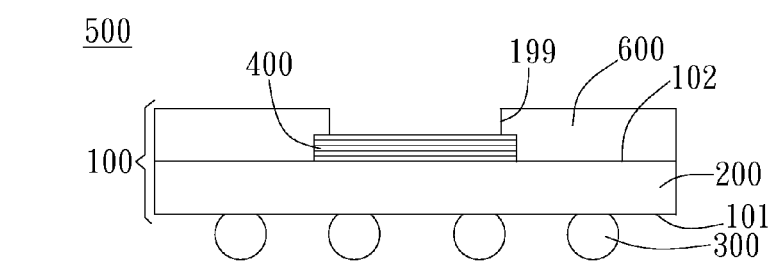

Step 2090 involves disposing a plurality of conductive connecting elements on the first surface so as to be coupled to the sensing unit. More particularly, as shown in FIG. 8E, the BGA is disposed on the first surface 101 as the conductive connecting element 300. The conductive connecting element 300 is coupled to the sensing unit 400 by the wire (not shown in figure) in the substrate 200.

Figure 8F:
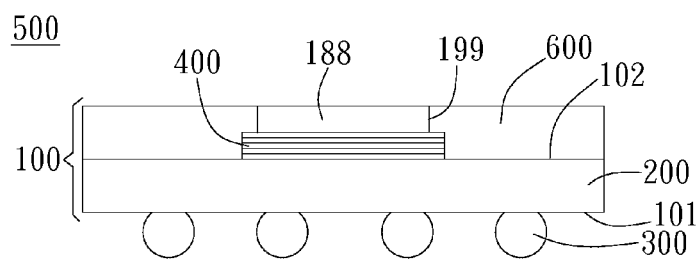

In another embodiment, the light sensor manufacturing method further includes step 2110, which involves disposing a lens on the window. More particularly, a liquid-state resin is injected into the window 199 and then illuminated by ultraviolet light or heated to harden to form the lens 188 as shown in FIG. 8F. The shape of the lens 188 can be controlled by the injecting amount of the liquid-state resin. For example, when the injecting amount of the liquid-state resin is slightly more than the containable volume of the window, the liquid-state resin can protrude out of the opening of the window to form a convex lens due to surface tension.

Specifically, comparing the embodiment shown in FIGS. 6A-6F and the embodiment shown in FIGS. 8A-8F, it is found that the main difference between the two is the order in the formation of the window 199. More particularly, in the embodiment shown in FIGS. 6A-6F, the conductive connecting elements 300 are disposed before forming the window 199 to prevent contaminants from contacting the sensing unit 400 while disposing the conductive connecting elements 300. In the embodiment shown in FIGS. 8A-8F, the window 199 is formed before disposing the conductive connecting elements 300. In other words, the window 199 is formed in a front-end process of the sensing chip 100, including the formation of the first surface 101, the second surface 103, and the sensing unit 400, and the disposing of the conductive connecting elements 300 is completed in a back-end packaging process, so that the manufacturing process is smoother.

Figure 9A:
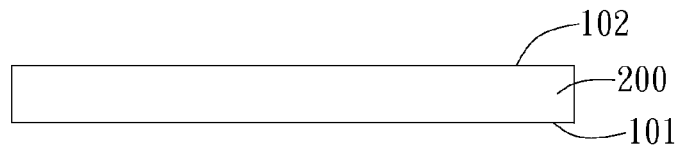
FIGS. 9A-9F are different schematic views showing the manufacturing steps of the light sensor of the present invention.
Figure 9B:
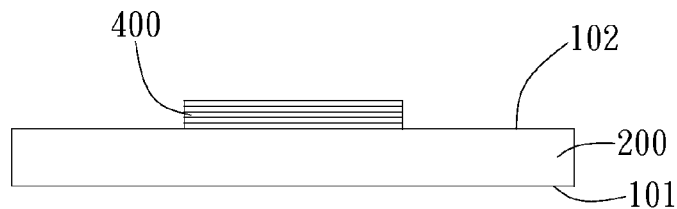
Figure 9C:
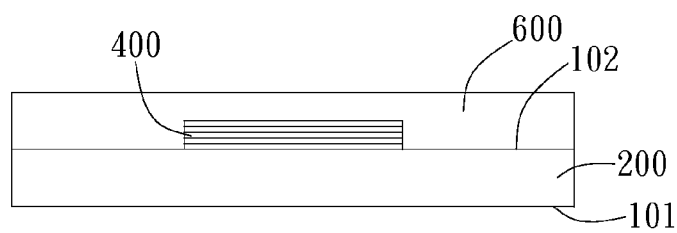
Figure 9D:
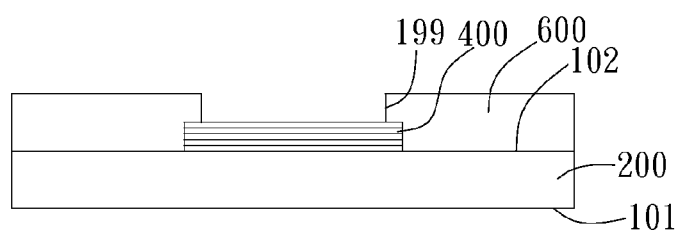
Figure 9E:
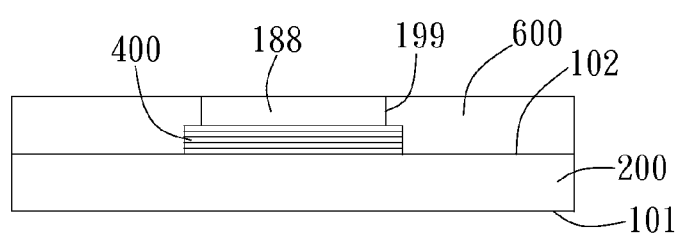
Figure 9F:
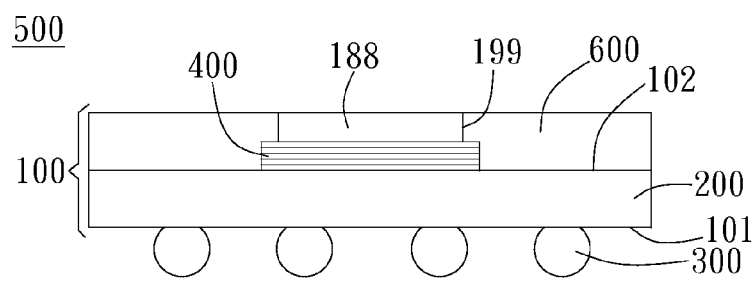

As another embodiment shown in FIGS. 9A-9F, after the forming of the window 199 in the front-end process, the lens 188 may first be disposed on the window as shown in FIG. 9E, and the conductive connecting elements 300 is disposed as shown in FIG. 9F. Hence, not only the manufacturing process is kept smooth, but also contaminants may be kept from contacting the sensing unit 400 while the conductive connecting elements 300 are being disposed.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A light sensor capable of being coupled to a carry object, comprising:
a sensing chip, including:
a first surface, wherein the first surface faces the carry object when the light sensor is coupled to the carry object;
a second surface, wherein the second surface is opposite to the first surface and has a window; and
a sensing unit disposed between the first surface and the second surface and at least partially exposed by the window;
a substrate having the first surface and a supporting surface opposite to each other, wherein the sensing unit is disposed on the supporting surface; and
a cover covering the supporting surface and having a window at least partially exposing the sensing unit;
a plurality of conductive connecting elements disposed on the first surface and coupled to the sensing unit in order to couple the light sensor to the carry object.

2. The light sensor of claim 1, wherein the conductive connecting elements are solder balls.

3. The light sensor of claim 1, wherein the sensing unit has a third surface and a fourth surface opposite to each other, wherein the third surface is close to the first surface, and the fourth surface is at least partially exposed by the window.

4. The light sensor of claim 1, wherein the sensing unit is a PIN diode.

5. The light sensor of claim 1, wherein the sensing unit is a stack structure.

6. The light sensor of claim 5, wherein the sensing unit is a five-layer stack structure, including:
a lower electrode;
a first conductive hydrogenated amorphous silicon (a-Si:H) layer disposed on the lower electrode;
an intrinsic hydrogenated amorphous silicon layer disposed on the first conductive hydrogenated amorphous silicon layer;
a second conductive hydrogenated amorphous silicon layer disposed on the intrinsic hydrogenated amorphous silicon layer; and
an upper electrode disposed on the second conductive hydrogenated amorphous silicon layer and at least partially exposed by the window.

7. A light sensor manufacturing method, comprising:
providing a substrate having a first surface and a supporting surface opposite to each other;
disposing a sensing unit on the supporting surface;
disposing a cover on the supporting surface to cover the supporting surface and the sensing unit;
disposing a plurality of conductive connecting elements on the first surface so as to be coupled to the sensing unit; and
forming a window on the cover to at least partially expose the sensing unit.

8. The light sensor manufacturing method of claim 7, wherein the step of disposing the plurality of conductive connecting elements on the first surface includes using solder balls as the conductive connecting elements.

9. The light sensor manufacturing method of claim 7, wherein the steps of disposing the sensing unit on the supporting surface include:
disposing a lower electrode on the supporting surface;
disposing a first conductive hydrogenated amorphous silicon (a-Si:H) layer on the lower electrode;
disposing an intrinsic hydrogenated amorphous silicon layer on the first conductive hydrogenated amorphous silicon layer;
disposing a second conductive hydrogenated amorphous silicon layer on the intrinsic hydrogenated amorphous silicon layer; and
disposing an upper electrode on the second conductive hydrogenated amorphous silicon layer.

* * * * *